United States Patent
Stamper et al.

[11] Patent Number: 5,907,763
[45] Date of Patent: May 25, 1999

[54] METHOD AND DEVICE TO MONITOR INTEGRATED TEMPERATURE IN A HEAT CYCLE PROCESS

[75] Inventors: Anthony K. Stamper, Williston; Thomas J. Hartswick, Underhill, both of Vt.

[73] Assignee: International Business Machines Corporation, Armonk, N.Y.

[21] Appl. No.: 08/702,082

[22] Filed: Aug. 23, 1996

[51] Int. Cl.⁶ ...................................................... H01L 21/66
[52] U.S. Cl. ............................ 438/14; 438/54; 324/158.1
[58] Field of Search .................................. 438/14, 15, 17, 438/18, 54, 55; 324/105, 703, 158.1

[56] References Cited

U.S. PATENT DOCUMENTS

| | | |
|---|---|---|
| 3,388,457 | 6/1968 | Totta . |
| 4,826,787 | 5/1989 | Muto et al. . |
| 5,173,327 | 12/1992 | Sandhu et al. . |
| 5,175,115 | 12/1992 | Abe et al. . |
| 5,293,216 | 3/1994 | Moslehi ................................ 219/121.6 |
| 5,386,195 | 1/1995 | Hayes et al. . |
| 5,393,699 | 2/1995 | Mikoshiba et al. . |
| 5,490,228 | 2/1996 | Soma ......................................... 118/50 |
| 5,490,728 | 2/1996 | Schietinger et al. ......................... 374/7 |
| 5,719,445 | 2/1998 | Moslehi ................................ 324/158.1 |

*Primary Examiner*—Kevin M. Picardat
*Attorney, Agent, or Firm*—Schmeiser, Olsen & Watts; William D. Sabo

[57] ABSTRACT

A method and device to monitor integrated temperature in a heat cycle process is disclosed. A monitor wafer, according to one embodiment, comprises a substrate, typically a silicon wafer, having films of two conductive materials of selected electrical resistances, sequentially deposited thereon. Suitable conductive materials react with each other in the presence of heat to yield a layer of a third, non-conductive or less conductive, material at the interface of the two conductive materials. The thickness of each of the films of the two conductive materials is selected such that the entire thickness is not consumed in the formation of the layer of a third material. Following the heat exposure, electrical resistance of the monitor wafer is determined and compared with the monitor wafer's selected pre-heat electrical resistance. The change in electrical resistance is then correlated to temperature by a thermocouple probe on a set of test wafers having the same blanket metal structure as the monitor wafer.

11 Claims, 2 Drawing Sheets

METHOD AND DEVICE TO MONITOR INTEGRATED TEMPERATURE IN A HEAT CYCLE PROCESS

TECHNICAL FIELD

This invention relates generally to the manufacture of semiconductor devices, and more specifically to a method and device to monitor integrated temperature across a device in a semiconductor processing heat cycle.

BACKGROUND OF THE INVENTION

In the manufacture of semiconductor devices, such as wafers to be diced into integrated circuit chips, it is necessary to monitor integrated temperature across the wafer in a heat cycle process. Examples of semiconductor processing involving heat cycles include, but are not limited to, rapid thermal annealing, physical vapor deposition (PVD), chemical vapor deposition (CVD), plasma enhanced CVD (PECVD) and high density plasma CVD (HDPCVD).

Several disadvantages are associated with existing pyrometric monitoring devices and techniques, such as infrared (IR) temperature probes or thermocouple direct contact on wafers. First, these techniques generally only provide a temperature measurement of a single point on the wafer surface, rather than across an entire wafer. Second, these measurements provide instantaneous temperature values, rather than an integrated temperature measurement over the course of the entire heat cycle. Third, the measurement obtained by these techniques is often more of an environmental temperature rather than a measurement of the temperature across the wafer surface.

Still another disadvantage of existing pyrometric monitoring techniques is that IR probes do not work, or do not work effectively, when there are films or patterned structures on the surface of the wafer. Moreover, IR probes are ineffective in low temperature regimes and, with aluminum-copper wiring, which is currently the standard wiring in semiconductor integrated circuits, the desired temperature range is generally 350 to 400 degrees Celsius, a range in which IR probes are ineffective. Yet another disadvantage is that while existing pyrometric techniques work well in a laboratory environment, they do not function well in the manufacturing environment due to conditions such as wafer backside variations and degradation of the optic fiber of the pyrometric tool.

Therefore, there exists a need to develop an easy and effective method and device to accurately monitor integrated temperature across a wafer in a semiconductor processing heat cycle.

SUMMARY OF THE INVENTION

A method and device to monitor the integrated temperature across a device over the course of a semiconductor processing heat cycle, such as rapid thermal annealing, physical vapor deposition (PVD), chemical vapor deposition (CVD), plasma enhanced CVD (PECVD), high density PECVD (HDPCVD) and others, is disclosed. Existing monitoring methods, such as infrared (IR) probes or thermocouple direct contact on a device are associated with several disadvantages which are overcome by the present invention.

A device according to one embodiment of the present invention comprises a monitor wafer having films of two conductive materials of selected electrical resistance, sequentially deposited thereon. The conductive materials react with each other in the presence of heat to form an intermediate layer of a third material at their interface. The thickness of each of the films of the two conductive materials is selected such that over the time and temperature range of the specific heat cycle process, the entire thickness is not consumed in the formation of the layer of a third material. Furthermore, the two conductive materials are chosen such that the resulting third material is non-conductive, or less conductive than the more conductive of the two original materials.

In a method using a device according to one embodiment of the present invention, the electrical resistance of the monitor wafer is determined both before and after its exposure to the heat cycle, by means such as van der Pauw four point probe technique, and the change in resistance is calculated. This value is then correlated to an integrated temperature measurement determined by the use of a thermocouple probe on a set of test wafers having a blanket metal structure.

Therefore, the present invention overcomes each of the aforementioned disadvantages by providing an accurate temperature measurement across the entire wafer, rather than a single point measurement; providing an integrated temperature over the course of the entire heat cycle rather than an instantaneous temperature measurement; and providing a temperature measurement across the wafer surface rather than an environmental temperature measurement.

Numerous other advantages and features of the present invention will become readily apparent from the following detailed description of the preferred embodiment, the accompanying drawings and the appended claims.

DETAILED DESCRIPTION OF THE PREFERRED EMBODIMENT

Although this invention is susceptible to embodiment in many different forms, preferred embodiments of the invention are shown. It should be understood, however, that the present disclosure is to be considered as an exemplification of the principles of this invention and is not intended to limit the invention to the embodiments illustrated.

Figure 1:
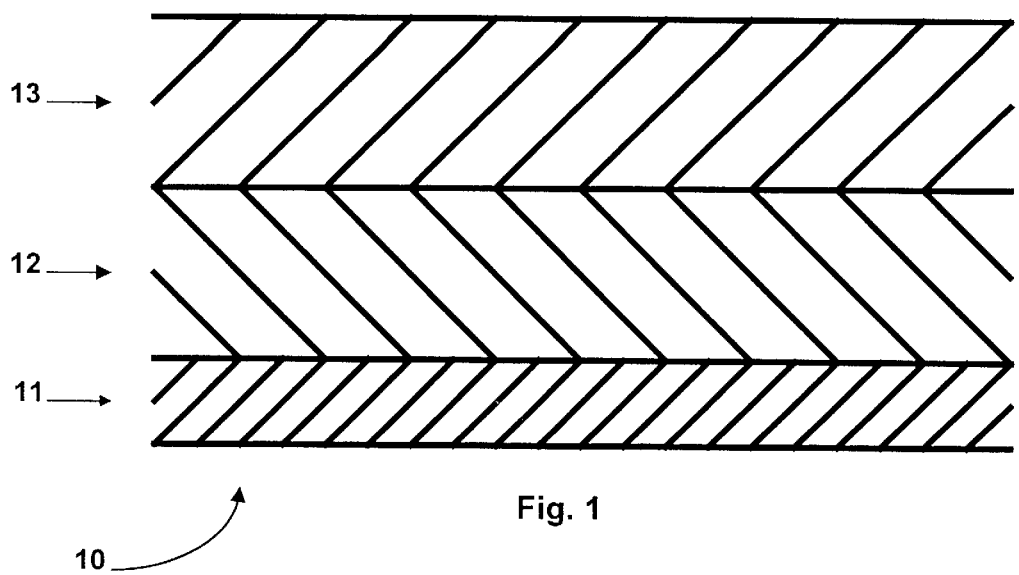
FIG. 1 is a schematic representation of a monitor wafer according to the present invention, prior to its exposure to heat.

Referring now to the drawings, FIG. 1 shows a device, generally designated as 10, which according to one embodiment of the present invention is suitable for use as a monitor wafer to monitor temperature in a heat cycle process such as rapid thermal annealing, physical vapor deposition (PVD), chemical vapor deposition (CVD), plasma enhanced CVD (PECVD), high density PECVD (HDPCVD) and others. Device 10 comprises a substrate 11, generally a silicon wafer, having two films of differing conductive materials 12 and 13 of selected electrical resistances, sequentially deposited thereon.

Preferably, conductive materials 12 and 13 are deposited by physical vapor deposition (PVD), although other methods such as chemical vapor deposition (CVD) or electroplating can also be used. Suitable conductive materials are ones which will react with each other in the presence of heat to form a third material which is non-conductive or less conductive than the two original materials. Examples include: titanium and aluminum; copper and zinc; copper and tin; aluminum and tin; nickel and tin; and silver and tin. Conductive materials 12 and 13 are deposited to a selected thickness whereby at the temperature and time range of the specific heat cycle process, only a portion of each layer will be consumed to form the intermediate third material.

Figure 2:
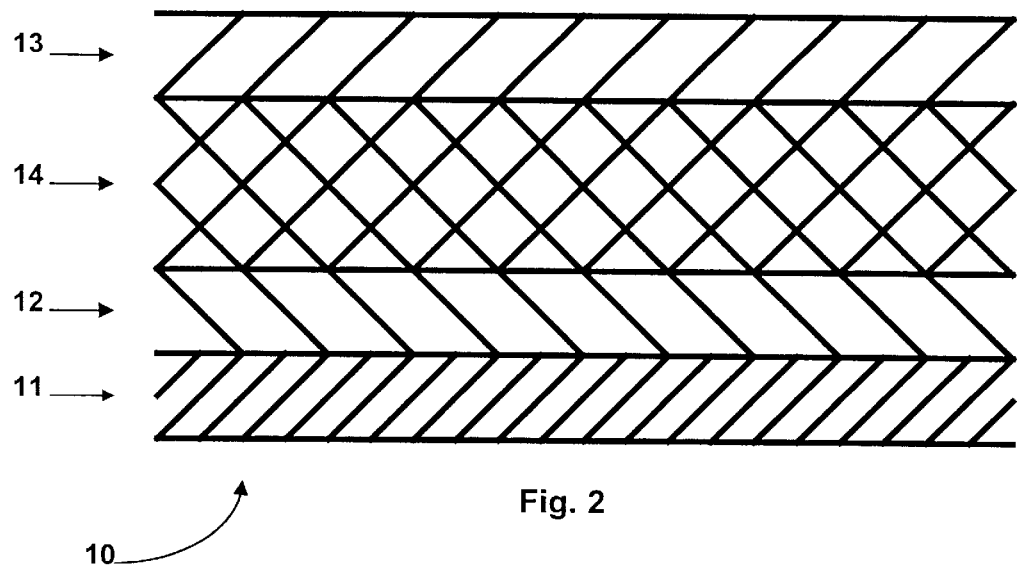
FIG. 2 is a schematic representation of a monitor wafer according to one embodiment of the present invention, following its exposure to heat.

In a method of use according to another embodiment of the present invention, device 10 is prepared and employed as a monitor wafer in a heat cycle process. FIG. 2 illustrates the structure of device 10 following its exposure to heat. Conductive materials 12 and 13 have reacted to yield a layer of a third material 14 at the interface of materials 12 and 13. In a particularly preferred embodiment, the layers 12 and 13 are titanium and aluminum and at higher temperatures the two layers form the layer 14, which is titanium trialuminide.

Figure 3:
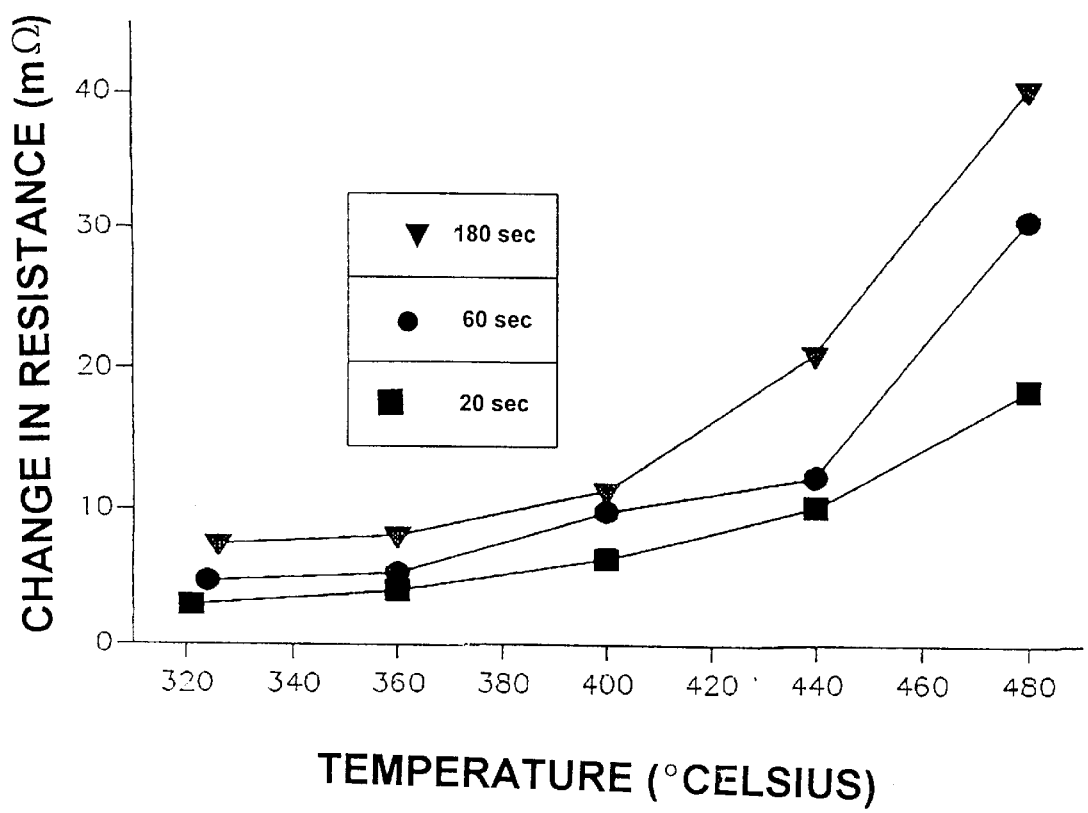
FIG. 3 is a graphic representation of the change in electrical resistance in a monitor wafer according to the present invention, as a function of time and temperature.

Following the heat exposure, the electrical resistance of device 10 is determined. This measurement is compared to the original selected resistance of device 10 before its exposure to heat in order to determine the change in resistance. This value is then correlated to temperature by means of a thermocouple probe on a set of test wafers having the same blanket metal structure. FIG. 3 graphically illustrates the correlation data obtained with a set of test wafers of titanium and aluminum following exposure to PECVD $SiO_2$ deposition for 20, 60 and 180 seconds.

EXAMPLE

In one practice of the present invention, an entire surface of a test wafer was coated with titanium, at a thickness of approximately 500 Å, then coated with copper doped aluminum, at a thickness of about 3,000 Å, and finally coated with a top layer of titanium, at a thickness of about 500 ÅA. As long as the aluminum layer is at least three times as thick as the titanium, any thickness of the various layers should perform the function. Additionally, it is not necessary to have both a top coat and a bottom coat of the titanium, and equivalent results are obtained using titanium on the the bottom layer only.

The coated wafer is then heated to a temperature between about 275° C. to about 550° C. for a given amount of time. The temperature is chosen depending upon the process parameters for the production line this measurement device is going to be utilized in and the substances used as wiring layers and passivating materials. Typically, the materials used are aluminum-copper wire in a silicon dioxide passivating material and the optimal temperatures for processing occur between about 300° C. and about 425° C., so the monitor wafer is heated to about 350° C.±25° C. The time the aluminum-copper and titanium layers are reacted for is somewhere between about 1 sec. and about 5 min. The preference in time will depend upon the heat cycle process to be monitored. In the case of PECVD or HDPCVD, it has been found that about 3 min. is an optimal time. The time and temperature are usually controlled so that the end result is that about 20% of the thickness of the aluminum is lost by conversion into the titanium trialuminide. The coated wafer is then run through a low temperature (<150° C.) $SiO_2$ RIE strip. By comparing the pre- and post-processing resistance, the wafer temperature is calculated.

This invention has been described in terms of specific embodiments, set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

We claim:

1. A device to monitor integrated temperature in a heat cycle process, said device comprising a monitor wafer having a film of a first conductive material of a selected electrical resistance and a film of a second conductive material of a selected electrical resistance sequentially deposited thereon, wherein the first and the second conductive materials will react with each other during the heat cycle process to yield a layer of a third material at an interface of the first and the second conductive materials.

2. The device of claim 1 wherein the first and the second conductive materials are deposited to a selected thickness wherein the entire selected thickness is not consumed during the formation of the layer of a third material.

3. The device of claim 2 wherein the third material is less conductive than the more conductive of the first and the second conductive materials.

4. The device of claim 2 wherein the third material is non-conductive.

5. The device of claim 3 wherein the first conductive material is titanium and the second conductive material is aluminum and the third material is titanium trialuminide.

6. A method to monitor integrated temperature in a heat cycle process, comprising the steps of:

providing a substrate;

depositing a selected thickness of a film of a first conductive material having a selected electrical resistance onto the substrate;

depositing a selected thickness of a film of a second conductive material having a selected electrical resistance onto the film of a first conductive material to form a monitor wafer;

exposing the monitor wafer to a heat cycle process wherein the first and the second conductive materials react with each other to yield a layer of a third material at an interface of the first and the second conductive materials;

measuring an electrical resistance of the monitor wafer;

determining a change in the electrical resistance of the monitor wafer following its exposure to a heat cycle process; and correlating the change in electrical resistance to temperature.

7. The method of claim 6 wherein the step of depositing the film of a selected thickness of a first material and the step of depositing the film of a selected thickness of a second conductive material comprise depositing a thickness that is not completely consumed during the formation of the layer of a third material.

8. The method of claim 7 wherein:

the step of depositing the film of a first conductive material comprises depositing a film of titanium; and the step of depositing the film of a second conductive material comprises depositing a film of aluminum.

9. A method to monitor integrated temperature in a heat cycle process comprising the steps of:

providing a substrate;

depositing a selected thickness of a titanium film onto the substrate;

depositing a selected thickness of an aluminum film onto the titanium film to form a monitor wafer;

exposing the monitor wafer to a heat cycle process wherein the titanium and the aluminum films react with each other to yield a layer of titanium trialuminide at an interface of the titanium and the aluminum films;

measuring an electrical resistance of the monitor wafer;

determining a change in the electrical resistance of the monitor wafer following its exposure to a heat cycle process; and correlating the change in electrical resistance to temperature.

10. A method to monitor integrated temperature in a heat cycle process comprising the steps of:

providing a substrate;

sequentially depositing two or more films of conductive materials having selected thicknesses and electrical resistances onto the substrate to form a monitor wafer;

exposing the monitor wafer to a heat cycle process wherein bordering conductive materials react with each other to yield a layer of a resulting material at an interface of the bordering conductive materials;

measuring an electrical resistance of the monitor wafer;

determining a change in the electrical resistance of the monitor wafer following its exposure to the heat cycle process; and correlating the change in electrical resistance to temperature.

11. The method of claim 10 wherein the resulting material is less conductive than the more conductive of the two bordering conductive materials.

* * * * *

UNITED STATES PATENT AND TRADEMARK OFFICE
CERTIFICATE OF CORRECTION

PATENT NO. : 5,907,763
DATED : May 25, 1999
INVENTOR(S) : Stamper et al.

It is certified that error appears in the above-identified patent and that said Letters Patent is hereby corrected as shown below:

Column 3, Line 37, after "500A°" delete --A--

Signed and Sealed this

Thirtieth Day of May, 2000

Attest:

Q. TODD DICKINSON

*Attesting Officer*      *Director of Patents and Trademarks*